(12) United States Patent
Duarte et al.

(10) Patent No.: US 7,667,391 B2
(45) Date of Patent: Feb. 23, 2010

(54) ELECTRICALLY EXCITED ORGANIC LIGHT-EMITTING DIODES WITH SPATIAL AND SPECTRAL COHERENCE

(75) Inventors: Francisco J. Duarte, Rochester, NY (US); Kathleen M. Vaeth, Rochester, NY (US); Liang-Sheng Liao, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 614 days.

(21) Appl. No.: 11/499,474

(22) Filed: Aug. 4, 2006

(65) Prior Publication Data
US 2008/0030131 A1    Feb. 7, 2008

(51) Int. Cl.
 *H01J 1/62* (2006.01)
(52) U.S. Cl. .................. 313/506; 313/112; 313/503
(58) Field of Classification Search ......... 313/110–112, 313/503, 506
See application file for complete search history.

(56) References Cited

U.S. PATENT DOCUMENTS

| | | | |
|---|---|---|---|
| 4,768,292 A | 9/1988 | Manzei | |
| 5,141,671 A | 8/1992 | Bryan et al. | |
| 5,150,006 A | 9/1992 | Van Slyke et al. | |
| 5,151,629 A | 9/1992 | VanSlyke | |
| 5,405,709 A | 4/1995 | Littman et al. | |
| 5,484,922 A | 1/1996 | Moore et al. | |
| 5,593,788 A | 1/1997 | Shi et al. | |
| 5,645,948 A | 7/1997 | Shi et al. | |
| 5,683,823 A | 11/1997 | Shi et al. | |
| 5,755,999 A | 5/1998 | Shi et al. | |
| 5,928,802 A | 7/1999 | Shi et al. | |
| 5,935,720 A | 8/1999 | Chen et al. | |
| 5,935,721 A | 8/1999 | Shi et al. | |
| 6,020,078 A | 2/2000 | Chen et al. | |
| 6,475,648 B1 | 11/2002 | Hatwar et al. | |
| 6,534,199 B1 | 3/2003 | Hosokawa et al. | |
| 6,661,023 B2 | 12/2003 | Hoag et al. | |
| 2002/0127427 A1 | 9/2002 | Young et al. | |
| 2003/0198829 A1 | 10/2003 | Hoag et al. | |
| 2003/0203234 A1 | 10/2003 | Shi et al. | |
| 2003/0224202 A1 | 12/2003 | Brown et al. | |
| 2004/0001969 A1 | 1/2004 | Cosimbescu et al. | |

FOREIGN PATENT DOCUMENTS

WO    WO 98/55561    12/1998

(Continued)

OTHER PUBLICATIONS

Francisco J. Duarte, "Solid-state multiple-prism grating dye-laser oscillators", Technical Note, Optical Society of America, Jun. 20, 1994, vol. 33, No. 18, Applied Optics, pp. 3857-3860.

(Continued)

*Primary Examiner*—Joseph L Willliams

(57) ABSTRACT

A light-emitting device, comprising: a multi-layer stack of materials supported on an optically transparent support member, a first spatial filter, and a second spatial filter spaced from the first spatial filter. The multi-layer stack including at least one organic light-emitting layers, an anode layer, and a cathode layer. The first spatial filter is disposed intermediate the multi-layer stack of materials and the second spatial filter.

18 Claims, 11 Drawing Sheets

FOREIGN PATENT DOCUMENTS

| WO | WO 00/18851 | 4/2000 |
|---|---|---|
| WO | WO 00/57676 | 9/2000 |
| WO | WO 00/70655 | 11/2000 |

OTHER PUBLICATIONS

A. Maslyukov et al., "Solid-state dye laser with modified poly (mthyl methacrylate)-doped active elements", Applied Optics, Mar. 20, 1995, vol. 34, No. 9, pp. 1516-1518.

A. Costel et al., "Polymeric solid-state dye lasers: Recent developments", PCCP invited article, Phys. Chem. Phys,. 2003, vol. 5, pp. 4745-4763.

Francisco J. Duarte, "Multiple-prism grating solid-state dye laser oscillator: optimized architecture.", Applied Optics, Oct. 20, 1999, vol. 38, No. 30, pp. 6347-6349.

S. Riechel, et al., "Very compact tunable solid-state laser utilizing a thin-film organic semiconductor", 2001 Optical Society of America, May 1, 2001, vol. 26, No. 9, pp. 593-595.

W. Holzer et al., "Corrugated neat thin-film conjugated polymer distributed-feedback lasers", Applied Physics B, lasers and optics, 2002, pp. 333-342.

Ruidong Xia et al., "Fluorene-based polymer gain media for solid-state laser emission across the full visible spectrum", Applied Physics Letters, vol. 82, No. 21, May 26, 2003, pp. 3599-3601.

George Heliotis et al., "Light amplification and gain in polyfluorene waveguides", Applied Physics Letters, vol. 81, No. 3, pp. 45-417, Jul. 15, 2002.

M.D. McGehee et al., "Semiconducting polymer distributed feedback lasers", Applied Physics Letters, vol. 72, No. 13, pp. 1536-1538, Mar. 30 1998.

G. Kranzelbinder et al., "Organic solid-state lasers", Rep. Prog. Phys., vol. 63—Text Book, Aug. 1999.

V. G. Kozlov et al., "Optical properties of molecular organic semiconductor thin films under intense electrical excitation", Applied Physics Letter, vol. 74, No. 8, Feb. 22, 1999.

M.A. Baldo et al., "Prospects for electrically pumped organic lasers", Physical Review B 66, 2002, pp. 035321(1)-035321(16).

C.H. Chen et al., "Lasing characteristics of new coumarin-analog dyes: broadband and narrow-linewidth performance", Applied Optics, Feb. 1, 1988, vol. 27, No. 3, pp. 443-445.

Francisco J. Duarte, "Ray transfer matrix analysis of multiple-prism dye laser oscillators", Optical and Quantum Electronics, No. 21, 1989, pp. 47-54.

Chin Chen et al., "Efficient green organic light-emitting diodes with stericly hindered coumarin dopants", Applied Physics Letters, Nov. 26, 2001, pp. 3711-3713.

L.S. Liao et al., "High-efficiency tandem organic light-emitting diodes", Applied Physics Letters, Jan. 12, 2004, vol. 84, No. 2, pp. 167-169.

U.S. Appl. No. 10/437,195, filed May 13, 2003, titled: Cascaded Organic Electroluminescent Device Having Connecting Units With n-Type and p-Type Organic Layers, inventors: Liao et al.

U.S. Appl. No. 10/857,516, filed May 28, 2004, titled: Tandem Oled Having Stable Intermediate Connectors, inventors: Liao et al.

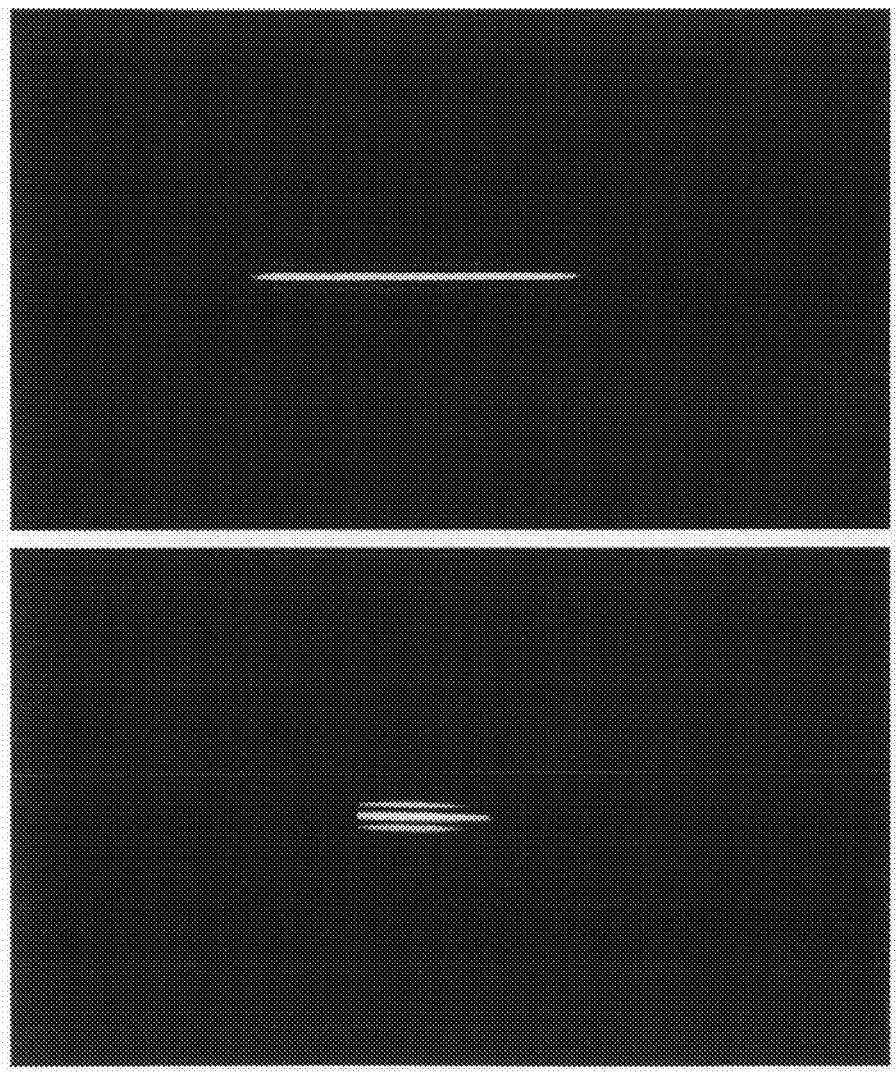

ELECTRICALLY EXCITED ORGANIC LIGHT-EMITTING DIODES WITH SPATIAL AND SPECTRAL COHERENCE

FIELD OF THE INVENTION

The invention relates generally to light-emitting devices, and more particularly to organic light-emitting diodes. More specifically, the invention relates to coherence characteristics of organic electroluminescent units to form an organic electroluminescent device.

BACKGROUND OF THE INVENTION

Organic electro-luminescent devices are well known. Organic electroluminescent (EL) devices are electronic devices that emit light in response to an applied potential. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs.

Organic light-emitting diode (OLED) technology incorporates organic luminescent materials that, when sandwiched between electrodes and subjected to an electric current (AC or DC), produce intense light of a variety of colors. These OLED structures can be combined into the picture elements or pixels that comprise a display, such as flat-panel displays in watches, telephones, laptop computers, pagers, cellular phones, calculators, and the like. OLEDs are also useful in a variety of applications as discrete light-emitting devices.

Optically excited organic dye lasers, in the liquid state, are well-known sources of powerful and highly coherent tunable laser emission. Two references which describe such lasers are: (1) F. P. Schäfer (ed.), Dye Lasers (Springer, Berlin, 1990), and (2) F. J. Duarte (ed.), High Power Dye Lasers (Springer, Berlin, 1991).

While such lasers can be powerful, these lasers can be rather large and complex and their attractiveness diminishes for many low power applications.

Recently, organic dye lasers have made a successful transition into the solid-state using highly homogeneous gain media comprised of dye-doped polymers. References which describe these developments include: F. J. Duarte, Appl. Opt. 33, 3857 (1994).; A. Maslyukov, S. Solokov, M. Kaivola, K. Nyholm, and S. Popov, Appl. Opt. 34, 1516 (1995); and A. Costela, I. Garcia-Moreno, and R. Sastre, Phys. Chem., Chem. Phys. 5, 4745 (2003).

Multiple-prism grating tunable laser oscillators, using dye-doped organic matrices, have been reported to yield nearly diffraction limited laser beams and single-longitudinal-mode emission at power levels in the kW regime. Refer to F. J. Duarte, Appl. Opt. 38, 6347 (1999).

Although these may be attractive for some applications, these lasers still require another laser as source of excitation. In this regard, it would be technologically advantageous to have semiconductor organic sources of coherent radiation excited directly by electrical means. Optically excited organic semiconductor films have been reported to lase by several authors. See, for example, S. Riechel, U. Lemmer, J. Feldman, S. Berleb, A. G. Mückl, W. Brütting, A. Gombert and W. Wittwer, Opt. Lett. 26, 593 (2001); and W. Holzer, A. Penzkofer, T. Pertsch, N. Danz, Abräuer, E. B. Kley, H. Tillmann, C. Bader, and H. H. Hörhold, Appl. Phys. B. 74, 333 (2002). See also Heeger and Bradley R. Xia, G. Heloitis, D. D. C. Bradley, Applied Physics Letters, 82 3599 (2003); and G. Heliotis, D. D. C. Bradley, G. A. Turnbull and I. D. W. Samuel, Applied Physics Letters, 81 415 (2002). A further reference is M. D. McGehee, M. A. Díaz-García, F. Hide, R. Gupta, E. K. Miller, D. Moses, and A. J. Heeger, Applied Physics Letters, 72, 13 1536 (1998).

As such, the subject of direct electrical excitation of organic lasers has been an issue discussed, for some time, in the open literature. For example, see: G. Kranzelbinder and G. Leising, Rep. Prog. Phys. 63, 729 (2000); V. G. Kozlov, P. E. Burrows, G. Parthasarity, and S. R. Forrest, Appl. Phys. Lett., 74, 1057 (1999); and M. A. Baldo, R. J. Holmes, and S. R. Forrest, Phys. Rev. B., 66, 35321 (2002).

It has been recognized that two of features of laser radiation are directionality of the emission, that is, low beam divergence, and spectral coherence, also known as narrow-linewidth emission. Therefore, any incipient study of a potential electrically excited organic laser must include these two basic parameters.

Accordingly, there exists a need for a direct electrical excitation of an electrically driven organic laser which provides for low beam divergence and spectral coherence.

The present invention provides an electrically driven organic laser which provides for low beam divergence and spectral coherence.

SUMMARY OF THE INVENTION

An object of the present invention is to provide an electrically driven organic light-emitting device which provides for low beam divergence.

Another object of the present invention is to provide such an electrically driven organic light-emitting device which provides for spectral coherence.

These objects are given only by way of illustrative example, and such objects may be exemplary of one or more embodiments of the invention. Other desirable objectives and advantages inherently achieved by the disclosed invention may occur or become apparent to those skilled in the art. The invention is defined by the appended claims.

According to one aspect of the invention, there is provided a light-emitting device, comprising: a multi-layer stack of materials supported on an optically transparent support member, a first spatial filter, and a second spatial filter spaced from the first spatial filter. The multi-layer stack includes at least one organic light-emitting layer, an anode layer, and a cathode layer. The first spatial filter is disposed intermediate the multi-layer stack of materials and the second spatial filter.

BRIEF DESCRIPTION OF THE DRAWINGS

The foregoing and other objects, features, and advantages of the invention will be apparent from the following more particular description of the embodiments of the invention, as illustrated in the accompanying drawings.

The elements of the drawings are not necessarily to scale relative to each other.

FIG. 5A shows a photographically recorded two-slit interferogram resulting from illumination with high-power emission from a coumarin 545 T laser excited transversely by a nitrogen laser.

FIG. 5B shows a photographically recorded two-slit interferogram resulting from illumination with the electrically excited tandem OLED configured with the two spatial filters in series as shown in FIG. 1B.

DETAILED DESCRIPTION OF THE INVENTION

Figure 1A:
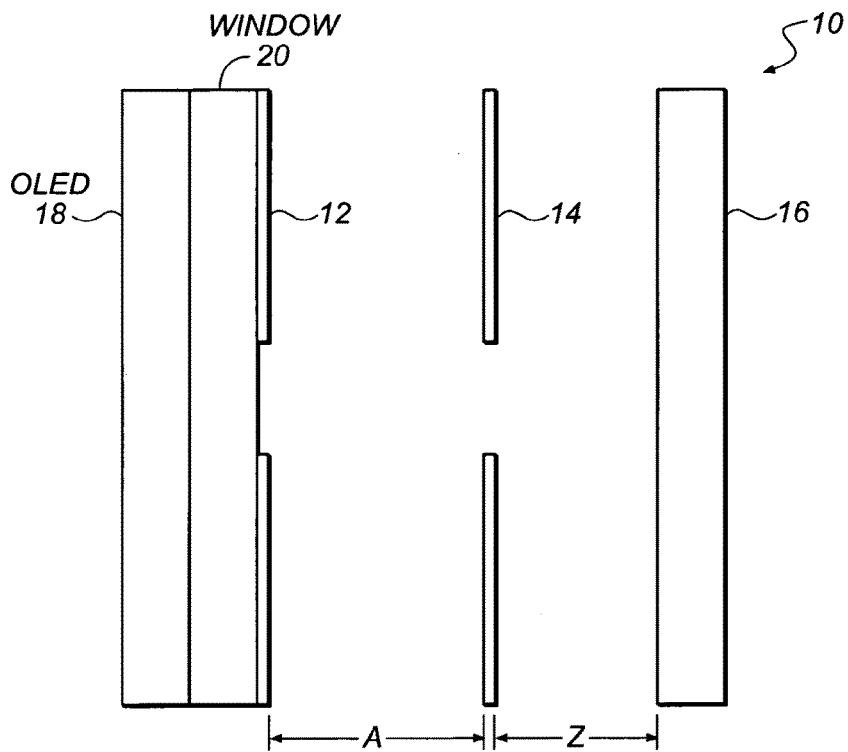
FIG. 1A shows a diagrammatic view of an electrically excited OLED in accordance with the present invention configured with two spatial filters in series.

The following is a detailed description of the preferred embodiments of the invention, reference being made to the drawings in which the same reference numerals identify the same elements of structure in each of the several figures.

The present invention is directed to an organic light-emitting diode (OLED) structure. As will become apparent, in an embodiment, a tandem organic light-emitting diode structure is described. A tandem organic light-emitting diode structure comprises two organic electro-luminescent units.

More particularly, the present invention is directed to an organic light-emitting diode (OLED) structure, excited electrically in the pulsed domain, and confined within a double spatial filter configuration, which is adapted to emit a low divergence beam with a near-Gaussian spatial distribution. In one embodiment, the emission originates from a laser dye coumarin 545 T used as dopant. Output power, for this spatially coherent radiation, is in the nano Watt regime.

As will be more particularly described, the spectral coherence of the present invention was determined using a double-slit interferometer and its behavior, as a function of distance, follows that calculated from first principles for monochromatic radiation. Further, the interferometric distribution from Applicant's doubly spatially confined tandem OLED device approximates the interferometric pattern obtained from well-known lasers emitting at a wavelength near 540 nm. The near-Gaussian spatial radiation distribution exhibits a divergence of $\Delta\theta \approx 2.53$ mrad which is about 1.1 times the diffraction limit. The range of the divergence of the emission beam can be between about 1.01 to about 7.5 times the diffraction limit.

The present invention provides for spatially coherent and spectrally semi-coherent emission in the pulsed regime, from an electrically excited OLED device. The emission medium is a laser dye coumarin 545 T (tetramethyl) which is doped into an Alq host material in a tandem OLED structure.

FIG. 1A shows a diagrammatic view of a light-emitting device 10 in accordance with the present invention. As shown in FIG. 1A, light-emitting device 10 includes a multi-layer stack of materials 18 (i.e., OLED 18) supported on an optically transparent support member 20, a first spatial filter 12, and a second spatial filter 14 spaced from first spatial filter 12.

As will be more particularly described below, multi-layer stack 18 includes at least one organic light-emitting layer, an anode layer, and a cathode layer.

As shown in the figure, first spatial filter 12 is disposed intermediate multi-layer stack of materials 18 and second spatial filter 14. In one arrangement, the distance between the two spatial filters, each about 150 µm wide, can range from about 100 mm to about 130 mm (shown as a distance A in FIG. 1A). Applicants have observed a nearly collimated emission (for example, on a digital detector or a photographic plate 16) at various distances (z) from second spatial filter 14.

It is noted that the spatial filters should be configured so as to enable single transverse mode emission as dictated by diffraction theory.

It is known to those skilled in the art that, in optical diffraction theory, the number of transverse modes depends on the aperture-to-aperture distance, the dimensions of the aperture, and the wavelength of emission. Thus, a single-transverse mode can be selected with various combinations of these parameters. One particular combination is the one described above that refers to a propagation distance greater than 100 mm (100 mm-130 mm range), aperture width of 100 micrometers, and a wavelength of 540 nm. In general, according to the theory, for a fixed propagation distance, the aperture width is decreased if the wavelength decreases. Or if, for a fixed propagation distance, the emission wavelength is increased then that allows for an increase in the aperture width. Alternatively, for a fixed aperture width, if the wavelength is decreased then the propagation length is increased. If, for a fixed aperture width, the wavelength is increased then the propagation length can be decreased.

Figure 1B:
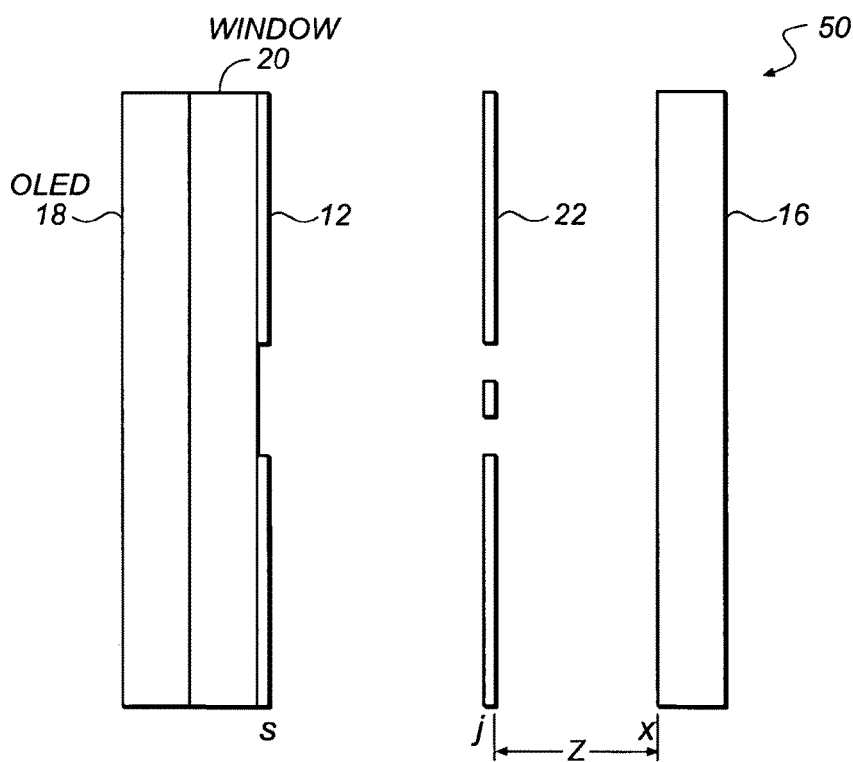
FIG. 1B shows a diagrammatic view of the optical schematics of an OLED device (with a two-slit interferometer) employed to determine the spectral coherence of the OLED of FIG. 1A.

FIG. 1B shows a diagramtic view of a device 50 configured to determine the spectral coherence of light-emitting device 10 of FIG. 1A. More particularly, FIG. 1B shows optical schematics of a device configured with a two-slit interferometer 22. Using standard nomenclature: the source is s, the slit array is represented by j, and the interference plane is x. Measurements are performed along the optical axis which is substantially orthogonal to the interference plane at x.

Spatially coherent emission from OLED 18 was selected using two spatial filters, in series, separated by distances in the 10-13 cm range, as referenced with regard to FIGS. 1A and 1B. Spatial coherence was determined by digitally, and photographically, recording the near-Gaussian intensity distribution following the second spatial filter. Spectral coherence was determined using a double-slit interferometer which includes a diode array detector 16, at the interference plane, for registration of the interferometric distribution.

Coumarin tetramethyl dyes are known to be highly efficient laser media and have been successfully used as dopant in OLED devices for some time now. For example, refer to: C. H. Chen, J. L. Fox, F. J. Duarte, and J. J. Ehrlich, Appl. Opt. 27, 443 (1988); F. J. Duarte, Opt. Quantum Electron. 21, 47 (1989); and C. H. Chen and C. W. Tang, Appl. Phys. Lett. 79, 3711-3713 (2001).

Applicant has generated a strong broadband laser emission using a coumarin 545 T in an ethanol solution at a concentration of 1 mM under the excitation of a nitrogen laser.

The coumarin 545 T-doped Alq is the emission layer in a high efficiency tandem OLED device similar to that reported by Liao et al. in L. S. Liao, K. P. Klubek, and C. W. Tang, Appl. Phys. Lett. 84, 167 (2004).

The term "host" refers to a material which has a concentration more than 50% by volume in a layer. Additional information regarding host materials is described below.

The term "hole transport layer" refers to a solid film that is predominantly transport positive charges (holes).

The term "electron transport layer" refers to a solid film that is predominantly transport negative charges (electrons).

The use of the term anode means an electrode that is capable of injecting positive charges (holes) into device.

The use of the term cathode means an electrode that is capable of injecting negative charges (electrons) into device.

The present invention's multi-layer stack of materials 18 is configured electrically, and optically in series, such as illustrated in FIGS. 2A through 2D.

Figure 2A:
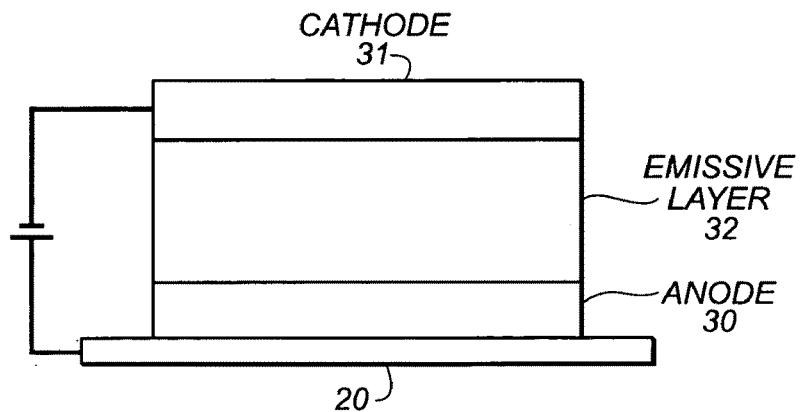
FIG. 2A shows a diagrammatic view of a thin film configuration of an OLED device suitable for use with the present invention.

Generally, FIG. 2A shows a suitable configuration of OLED 18 in accordance with the present invention comprising one organic light-emitting layer. As shown in FIG. 2A and discussed above, in one form, an organic electroluminescent device is comprised of an anode 30 for hole injection, a cathode 31 for electron injection, and an organic medium sandwiched between these electrodes to support charge recombination that yields emission of light. (i.e., light-emitting layer 32). An exemplary emission surface is 3 mm by 3 mm. The cathode 31 can be a mirror, i.e., a reflective cathode in multi-layer stack of materials 18.

Figure 2B:
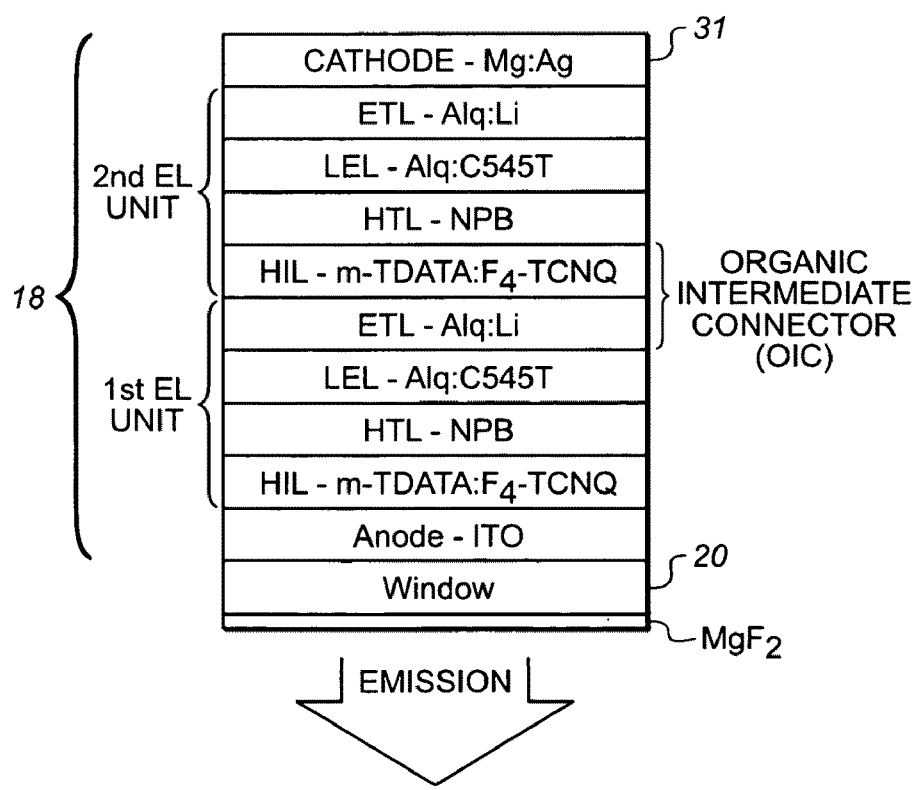
FIG. 2B shows a diagrammatic view of a thin film configuration of a tandem OLED device suitable for use with the present invention.
Figure 2C:
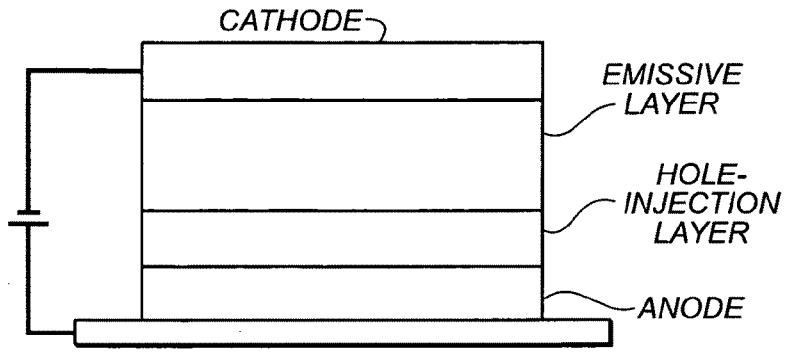
FIGS. 2C and 2D show diagrammatic views of further thin film configurations of an OLED device suitable for use with the present invention.
Figure 2D:
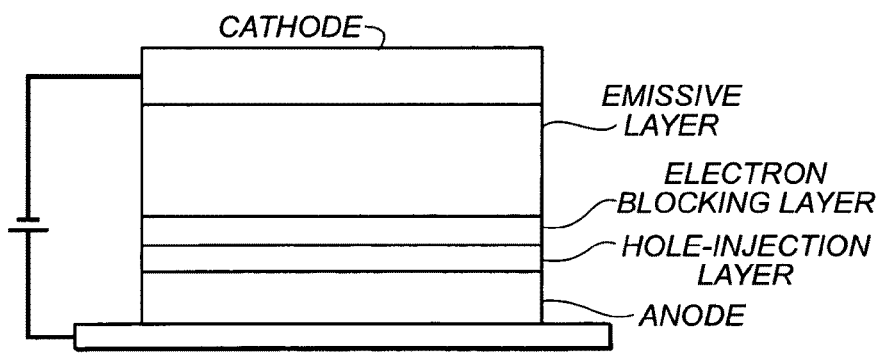
Figure 2E:
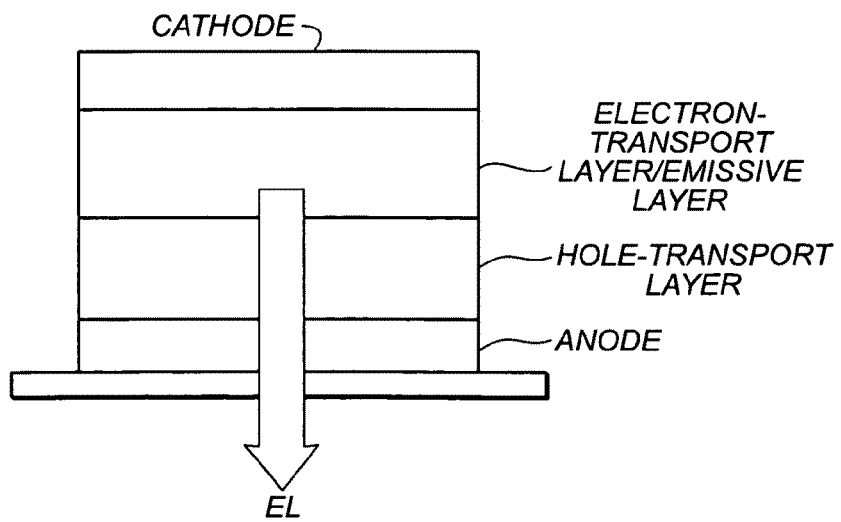
FIGS. 2E, 2F, and 2G show diagrammatic views of known OLED structures.
Figure 2F:
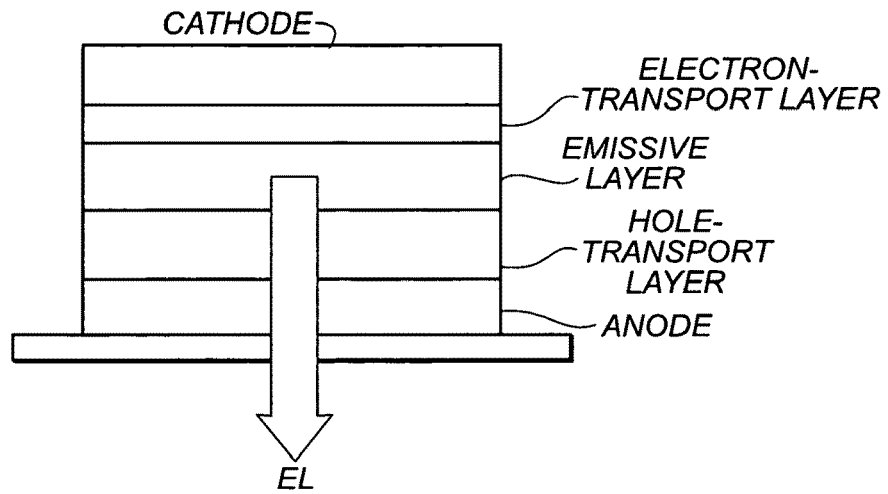
Figure 2G:
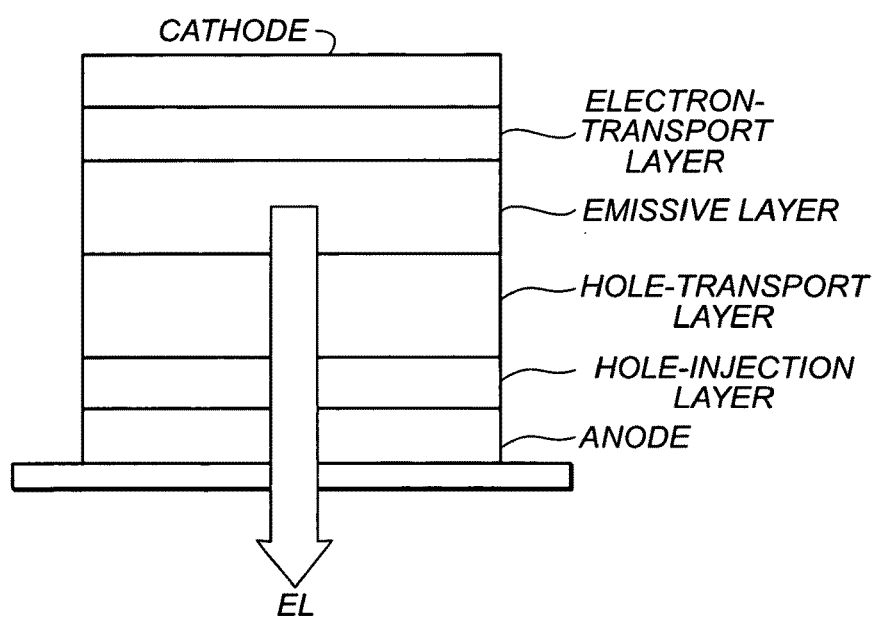

FIG. 2B shows another suitable configuration of OLED 18. FIG. 2B shows an embodiment of a thin film configuration of a tandem OLED device in accordance with the present invention. As indicated above, a tandem organic light-emitting diode structure comprises two organic electro-luminescent units. An exemplary emission surface is 3 mm by 3 mm. The cathode layer 31 depicted in FIGS. 1A and 1B is a reflective (mirror) cathode.

It is noted that an optional outside surface of the window can be provided which is antireflection coated. The antireflection coating is provided to avoid the unwanted reflection.

Still referring to FIG. 2B, there is shown two electroluminescent (EL) units sandwiched between a transparent indium-tin-oxide anode and a metal cathode mirror. Each EL unit includes a hole-injecting layer (HIL), a hole-transporting layer (HTL), a light-emitting layer (LEL), and an electron-transporting layer (ETL). The HIL is a m-TDATA layer doped with 3 vol % $F_4$-TCNQ; the HTL is an NPB layer; the LEL is an Alq layer doped with 1 vol % coumarin 545 T; and the ETL is an Alq layer doped with 1.2% lithium. In this description, m-TDATA refers to 4,4',4"-tris[(3-methylphenyl) phenylamino]triphenylamine; $F_4$-TCNQ refers to 2,3,5,6-tetrafluoro-7,7,8,8-tetracyano-quinodimethane; NPB refers to 4,4-bis[N-(1-naphthyl)-N-phenylamino]biphenyl; and Alq refers to tris(8-hydroxyquinoline)-aluminum. Exemplary thicknesses of the various films are shown in parenthesis.

This tandem OLED device can be fabricated using methods known to those skilled in the art, for example, on a glass window whose external surface is antireflection coated using $MgF_2$.

Other suitable configurations for OLED 18 may be known. For example, the organic light-emitting diode structure can comprise more than two organic electro-luminescent units. Indeed, other known OLEDs are well known, for example, those shown in FIGS. 2C through 2G. Refer also to commonly assigned U.S. patent application Ser. No. 10/437,195 filed May 13, 2003 entitled "Cascaded Organic Electroluminescent Device Having Connecting Units with n-Type and p-Type Organic Layers" by Liao et al., and commonly assigned U.S. patent application Ser. No. filed on May 28, 2004, entitled "Tandem OLED Having Stable Intermediate Connectors" by Liao et al, the disclosures of which are herein incorporated by reference.

It should be noted that the light-emitting layer can also be a polymeric material, a blend of two or more polymeric materials, or a doped polymer or polymer blend. The dopant can be selected from materials that exhibit optical gain, for example fluorescent and phosphorescent materials. Typical polymeric materials include, but are not limited to, substituted and unsubstituted poly(p-phenylenevinylene) (PPV) derivatives, substituted and unsubstituted poly(p-phenylene) (PPP) derivatives, substituted and unsubstituted polyfluorene (PF) derivatives, substituted and unsubstituted poly(diarylanthracene) derivatives, substituted and unsubstituted poly(p-pyridine), substituted and unsubstituted poly(p-pyridalvinylene) derivatives, and substituted, unsubstituted poly(p-phenylene) ladder and step-ladder polymers, and copolymers thereof as taught by Diaz-Garcia et al in U.S. Pat. No. 5,881,083 and references therein. The substituents include but are not limited to alkyls, cycloalkyls, alkenyls, aryls, heteroaryls, alkoxy, aryloxys, amino, nitro, thio, halo, hydroxy, and cyano. Typical polymers are poly(p-phenylene vinylene), dialkyl-, diaryl-, diamino-, or dialkoxy-substituted PPV, mono alkyl-mono alkoxy-substituted PPV, mono aryl-substituted PPV, 9,9'-dialkyl or diaryl-substituted PF, 9,9'-mono alky-mono aryl substituted PF, 9-mono alky or aryl substituted PF, PPP, dialkyl-, diamino-, diaryl-, or dialkoxy-substituted PPP, mono alkyl-, aryl-, alkoxy-, or amino-substituted PPP. The light-emitting layer (e.g., organic layers) can also be a combination of more than one small molecule and polymeric materials with or without dopants.

For Applicant's particular application, pulsed excitation can be provided by an Agilent 8114A pulse generator capable of delivering pulses of up to 100 V with a rise time of about 5 ns as determined with a Tektronix 7834 oscilloscope. The pulse repetition frequency (prf) used by Applicant was 67 Hz at pulse lengths in the 500-1000 μs range.

A feature of the pulsed configuration is that it allows excitation at high voltages while avoiding damage by reducing the energy delivered to the device. The fast rise time of the pulses can be compatible with the excitation of laser dyes but no attempt was made to study the dependence of the output as a function of this parameter. This was dictated by the extremely low output intensities which were not sufficient to trigger our fast response phototube typically used to characterize high-power laser emission.

Currents through the tandem OLED device were measured by observing the voltage across a 104 Ohm resistor connected in series to earth.

First spatial filter 12 disposed adjacent to an outside surface of window 20 restricts the emission. For example, first spatial filter 12 includes a slit to restrict emission to a region 3 mm long and 150 μm wide. First spatial filter 12 is perpendicular to the plane of propagation. This spatial restriction causes a wide divergence of the broadband emission from the tandem OLED. A second slit (i.e., second spatial filter 14), placed about 100-130 mm from the first slit, is used to further restrict spatially the emission. The full width of the second slit is also typically 150 μm. This second slit restricts transmission of only the central mode of the radiation. The emission transmitted through this second slit (see second spatial filter 14 of FIG. 1A) was either recorded directly on a linear diode array to determine its spatial distribution or it was used to illuminate a two-slit interferometer to measure its coherence characteristics.

The two-slit interferometer of FIG. 1B is a simpler version of various N-slit interferometers. The two slits are 50 μm in width and are separated by 50 μm. The distance (z) from the slits to the interferometric plane, where the digital detector is located, was varied from a few mm to about 50 mm.

Output powers were estimated by calibrating Applicant's linear photodiode array, incorporating 1024 elements each 25 μm in width, with a 4 mW He—Ne TEM$_{00}$ laser in conjunction with a series of calibrated neutral density filters.

Digitally detected interferometric distributions and beam profiles were photographically stored using Polaroid 667 film. Also, beam profiles were directly recorded on Polaroid 52 film using a simple camera free of lenses and imaging optics. Further, it should be noted that no lenses of any kind were used in the gathering of the data reported here.

Figure 3A:
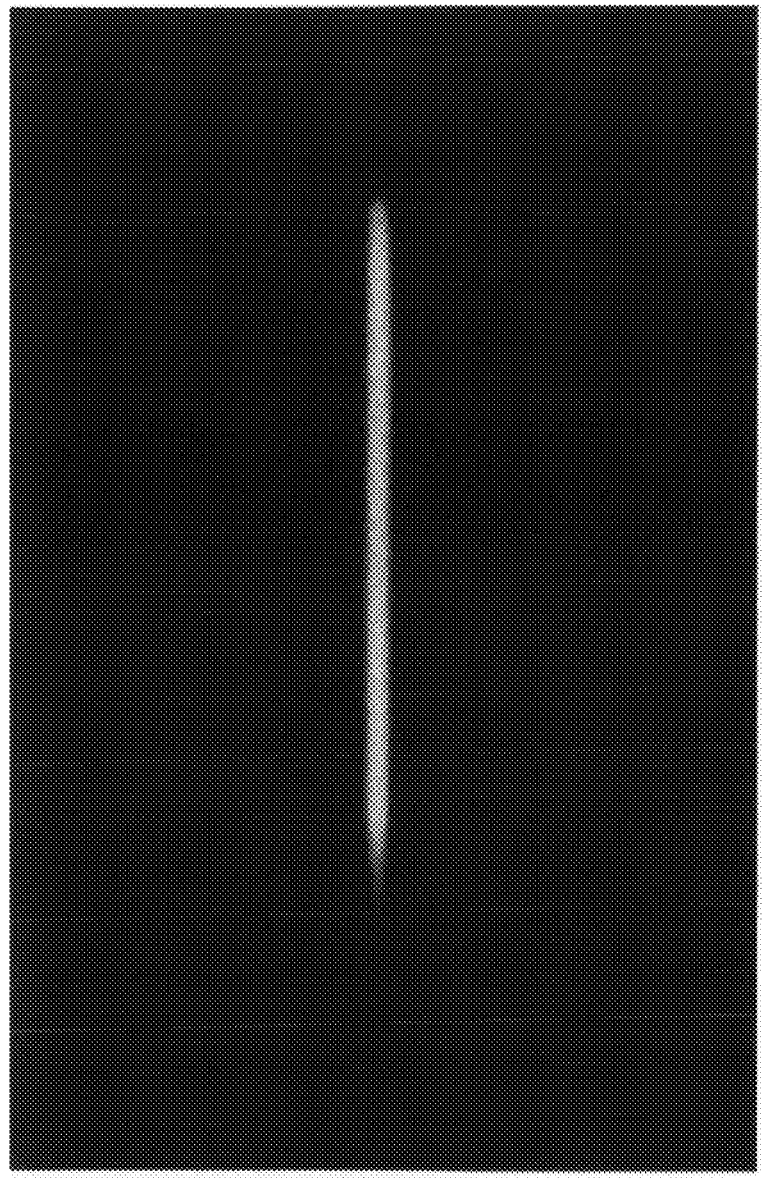
FIG. 3A shows a photographic profile of a near-Gaussian emission distribution at a distance 340 mm from the second spatial filter.
Figure 3B:
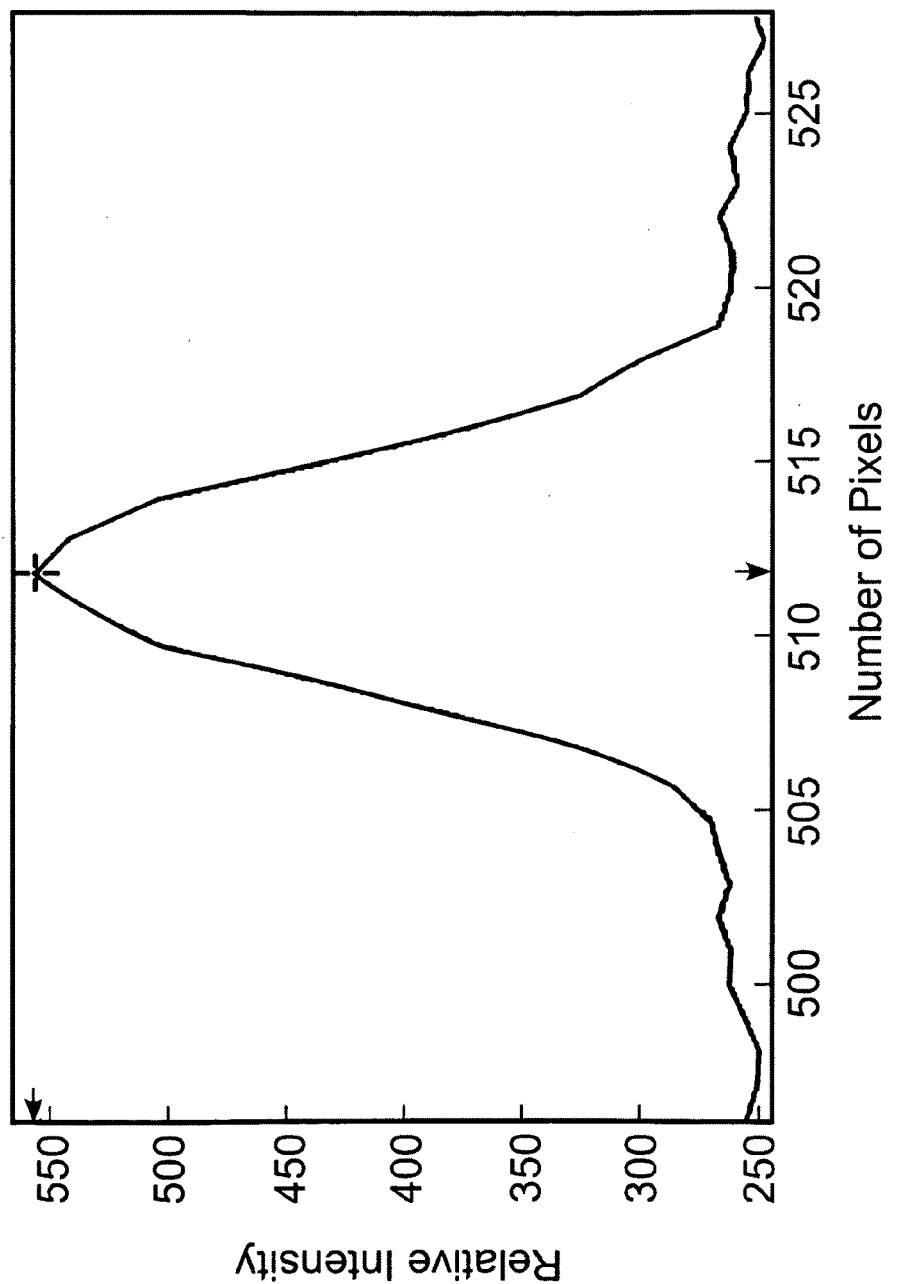
FIG. 3B shows a digital profile of a near Gaussian emission distribution at a distance 40 mm from the second spatial filter.

Using the two spatial filters in series, as illustrated in FIG. 1A, the digital profile of the emission 40 mm from the second slit is shown in FIG. 3B. A photographic distribution of this emission 340 mm from the second spatial filter is shown in FIG. 3A. The digital distribution of this emission is near-Gaussian. The measured beam divergence of this radiation is $\Delta\theta \approx 2.53$ mrad.

More particularly, FIG. 3B shows a digital profile of the near Gaussian emission distribution at a distance 40 mm from the second spatial filter (with the intra-filter separation being about 130 mm at a wavelength of 540 nm and a 150 μm with of the spatial filters). Each pixel is 25 μm wide. FIG. 3A shows a photographic profile of the near-Gaussian emission distribution at a distance 340 mm from the second spatial filter. The full width of the beam shown in this photograph is approximately 1.7 mm. (It should be noted that according to the physics of diffraction, such as described in F. J. Duarte, *Tunable Laser Optics* (Elsevier-Academic, New York, 2003), these dimensions are a function of wavelength. As such it should be understood that a plurality of dimensions can be used to yield beams with near-Gaussian distributions for various corresponding wavelengths.)

Figure 4A:
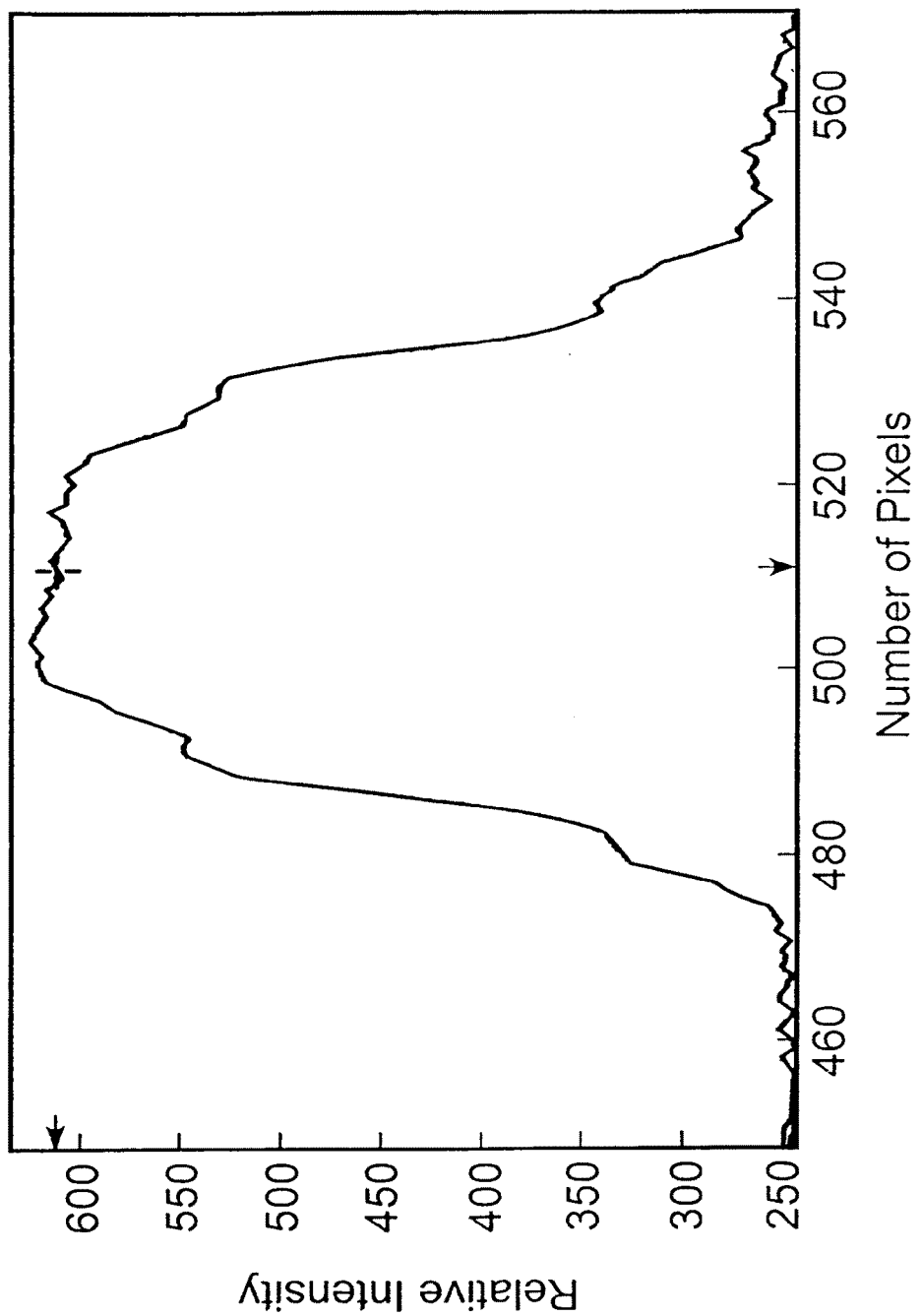
FIG. 4A shows a digital profile of a two-slit interference resulting from illumination with the broadband emission from the electrically excited tandem OLED device in the absence of a first spatial filter.

A two-slit interferogram for emission from the tandem OLED device in the absence of the first 150 μm spatial filter is shown in FIG. 4A. The broad undefined features of this interferogram are characteristic of incoherent broadband emission. The distance between the two slits and the interferometric plane, configured by the digital detector, is 50 mm.

Figure 4B:
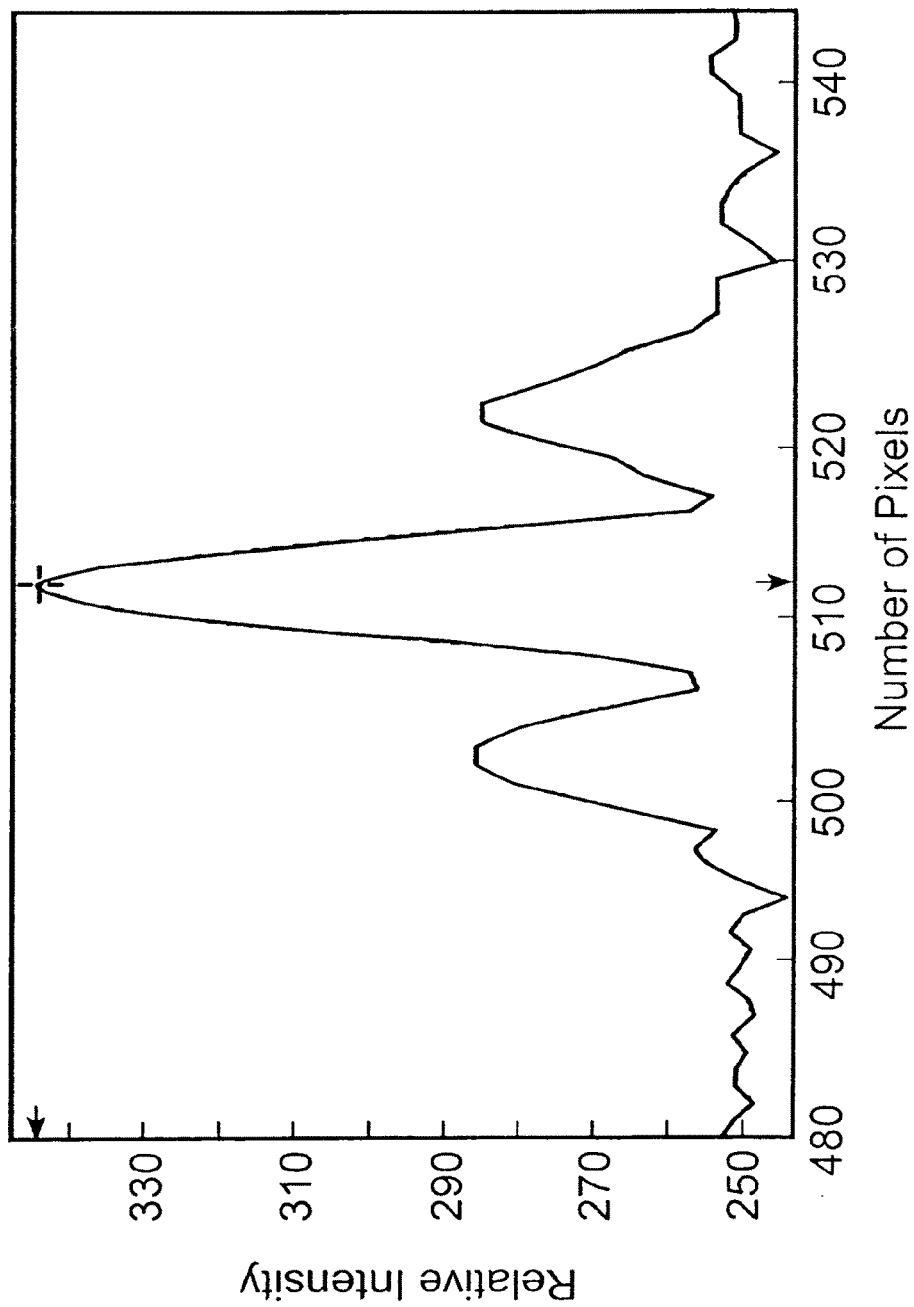
FIG. 4B shows a digital profile of a two-slit interference resulting from illumination with the electrically excited tandem OLED configured with the two spatial filters in series.
Figure 4C:
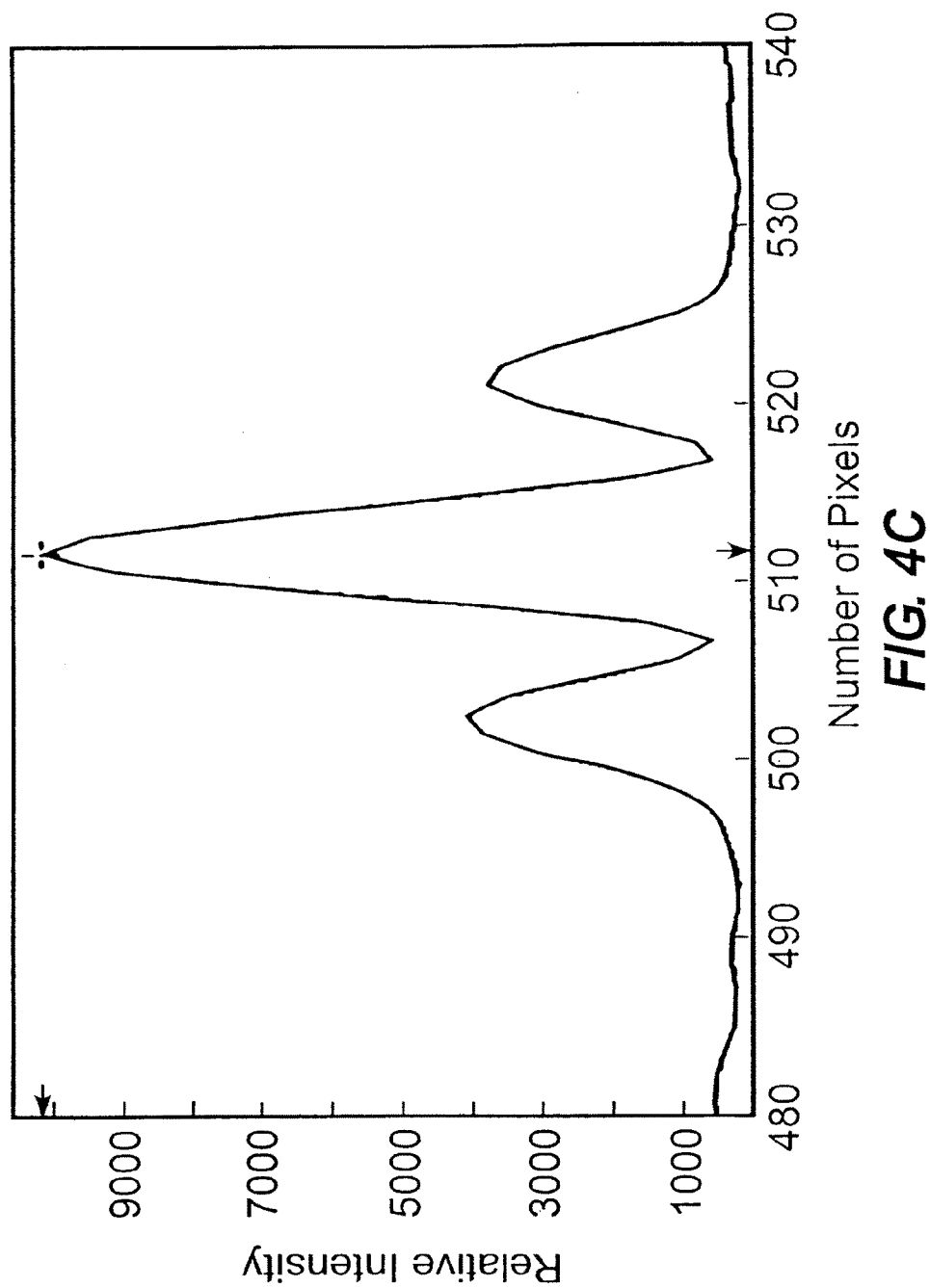
FIG. 4C shows a digital profile of a two-slit interference resulting from the illumination with a He—Ne laser, emitting in the $3s_2$-$2p_{10}$ transition, at a $\lambda$ of about 543.3 nm.
Figure 4D:
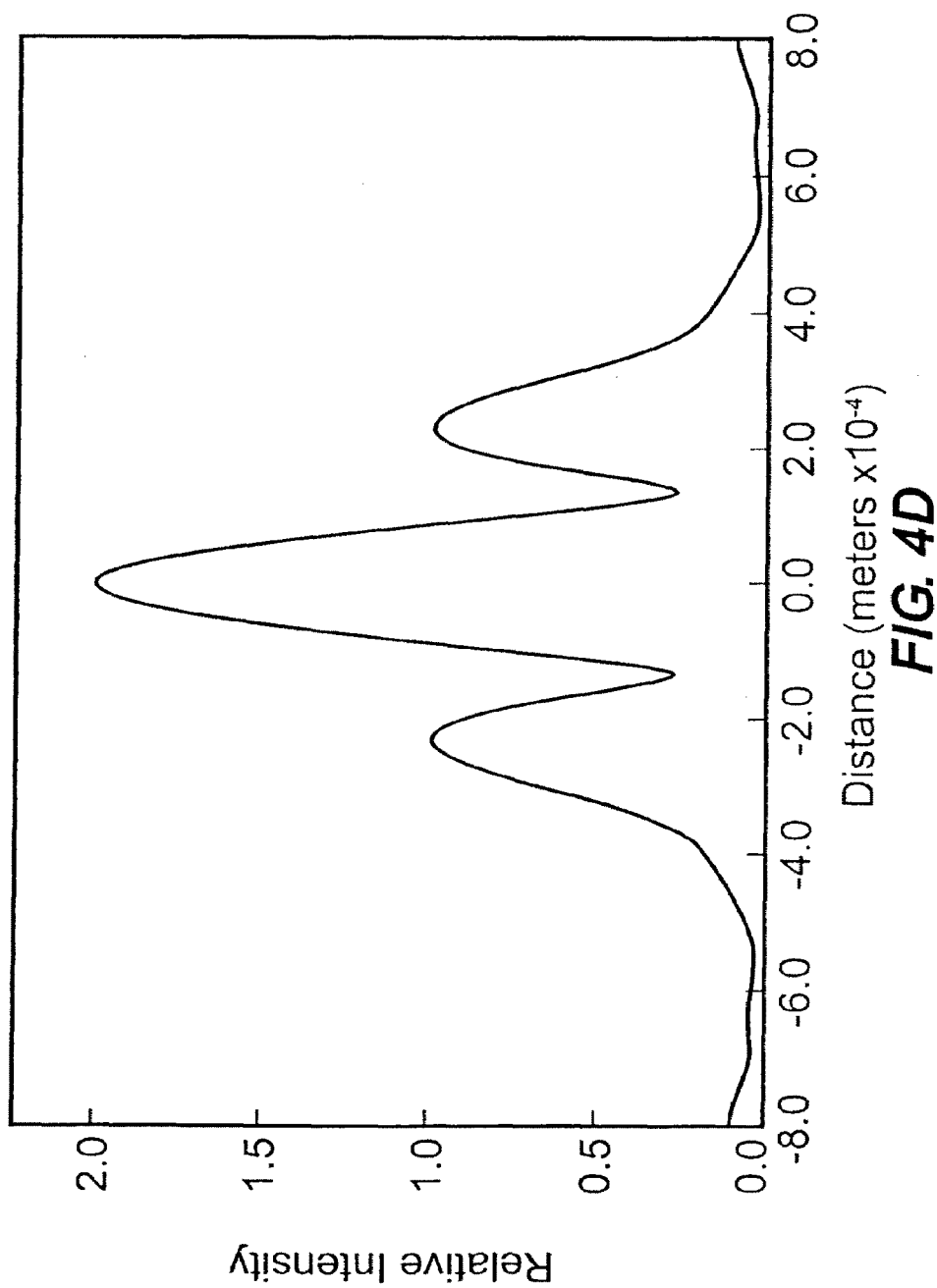
FIG. 4D shows a calculated profile of a two-slit interference assuming perfectly monochromatic radiation at a $\lambda$ of about 543.3 nm.

Reintroducing the first spatial filter, as depicted in FIG. 1B, yields a well defined two-slit interferogram as illustrated in FIG. 4B. The corresponding interferogram for a He Ne laser, with a measured linewidth of $\Delta v \approx 1$ GHz (at half-width), is shown in FIG. 4C. A theoretical interferogram (assuming perfectly coherent light, at $\lambda=543.3$ nm) is shown in FIG. 4D.

In all these cases the distance between the two slits and the interferometric plane, configured by the digital detector, is also 50 mm.

Use of the same optical arrangement, as in the doubly spatially filtered tandem OLED device, with an incandescent source yielded a beam divergence greater than 5 mrad and wide interference distributions typical of emission in a broad range of wavelengths.

At nearly full excitation voltage the peak intensity of the interferometric signal corresponds to about 1.5 nW. Assuming that the emission pulse is nearly as wide as the excitation pulse this corresponds to an energy less than or equal to ($\leqq$) 1.5 pJ. It should be noted that given the extremely low power of the emission from the spatially filtered tandem OLED the use of a standard Fabry-Perot etalon, with the necessary finesse, is not a practical alternative to determine linewidth. The same observation applies to attempts to characterize the emission using traditional dispersive spectrometers.

The interferometric emission from the spatially filtered tandem OLED device shows clearly two regions of operation as a function of current density. An initial linear increase, with a gradient of ~0.83 nW/(A/cm²), followed by a subsequent linear increase with a gradient of ~1.5 nW/(A/cm²). The point of transition occurs at a current density of $\rho_j=0.8$ A/cm² which corresponds to an excitation energy density of $\rho_E \approx 0.043$ J/cm². This gradient difference becomes less prevalent as the device is subjected to repeated operation at higher voltages. In this regard, it should be noted that the observed increase in output intensity as a function of current density is too timid to be compatible with the onset of laser behavior. Excitation at higher current densities, and shorter pulses, might yield further light on this topic.

Single-wavelength laser beam divergence can de derived from the uncertainty principle, and in its minimum expression, said to be diffraction limited, is given by the equation:

$$\Delta\theta \approx \lambda/\pi w$$

wherein λ is the wavelength of the emission and w is defined as the beam waist. For realistic laser cavities, this expression is multiplied by the square root of a factor incorporating the geometry of the resonator.

For a beam with $2w \approx 150$ μm the diffraction limited beam divergence is $\Delta\theta \approx 2.29$ mrads at 540 nm. This compares with a measured half-width beam divergence of $2.53\pm0.13$ mrads. This implies that the observed $\Delta\theta$ is about 1.1 times the diffraction limit. This result is compatible with a high degree of spatial coherence that compares extremely favorably with the beam characteristics of existing high-power narrow-linewidth tunable lasers.

A theoretical interferogram, assuming perfectly coherent light at $\lambda=543.3$ nm, is depicted in FIG. 4D and was calculated using a generalized interference equation derived using Dirac's notation.

For example, a simple one dimensional expression for the probability distribution, describing photon propagation from a source s to a plane of interference x, is given by the known equation:

$$|\langle x | s \rangle|^2 = \sum_{j=1}^{N} \Psi(r_j)^2 + 2 \sum_{j=1}^{N} \Psi(r_j) \left( \sum_{m=j+1}^{N} \Psi(r_m) \cos(\Omega_m - \Omega_j) \right)$$

wherein N is the number of slits, $\Psi(r_j)$ represent the amplitudes of "wave functions of ordinary wave optics", and $\cos(\Omega_m - \Omega_j)$ is the interference term that includes information about the wavelength λ and the geometry of the interferometer. This equation can also be used to predict the distribution from a single slit by representing the slit by hundreds of imaginary sub slits.

The difference between the interferograms from the broadband emission (FIG. 4A) and the narrowband emission (FIG. 4B) from the doubly spatially filtered tandem OLED device is clear.

The narrow well-defined features of FIG. 4B are a textbook example of the enhancement in coherence derived from the use of a double spatial filter at an appropriate distance, in this case 130 mm. One further feature, of practical significance, that is worth highlighting, is that the peak intensity of the narrow-band interferometric signal (FIG. 4B) is about 40% below the peak intensity of the broadband interferogram (FIG. 4A).

Comparison of the interferogram from the He—Ne laser ($\Delta \nu \approx 1$ GHz) (FIG. 4C) with the calculated distribution (FIG. 4D) indicates that the distance separating the secondary maxima agree within about 3% between experiment and theory.

The main differences between the interferogram from the tandem OLED device, including the double spatial filter, and the interferogram from the laser emission is that the secondary distributions are slightly broader and the minima are at a higher intensity level. These features are indicative of broader emission relative to the 1 GHz laser linewidth.

More particularly, FIG. 4A shows a digital profile of the two-slit interference resulting from illumination with the broadband emission from the electrically excited tandem OLED device in the absence of the first spatial filter.

FIG. 4B shows a digital profile of the two-slit interference resulting from illumination with the electrically excited tandem OLED configured with the two spatial filters in series (separated by 130 mm as shown in FIG. 1B). Background signal variations are due to detector noise. FIG. 4C shows a digital profile of the two-slit interference resulting from the illumination with a He—Ne laser, emitting in the $3s_2$-$2p_{10}$ transition, at $\lambda \approx 543.3$ nm. FIG. 4D shows a calculated profile of the two-slit interference assuming perfectly monochromatic radiation at $\lambda = 543.3$ nm. In all these figures, the slits are 50 μm wide, separated by 50 μm, and the distance between the slits (j) and the interference plane (x) is 50 mm. Each pixel represents a distance of 25 μm.

Referring now to FIGS. 5A and 5B, to determine how much broader the emission from the doubly spatially filtered tandem OLED device is, a photographically comparison is made between the interferometric signature from the present invention with the interferogram from a high-power broadband coumarin 545 T laser.

Generally, FIG. 5A shows a photographically recorded two-slit interferogram resulting from illumination with high-power emission from a coumarin 545 T laser excited transversely by a nitrogen laser. FIG. 5B shows a photographically recorded two-slit interferogram resulting from illumination with the electrically excited tandem OLED configured with the two spatial filters in series (separated by 130 mm as outlined in FIG. 1B). In both cases the slits are 50 μm wide, separated by 50 μm, and the distance (z) between the slits (j) and the interference plane (x) is 175 mm. Both photographs are at a 2:1 scale More particularly, the measured bandwidth of this laser is about 4 nm, at half width, which is typical for this class of laser. Hence, the spectral distribution from the doubly spatially filtered tandem OLED can be said to be, at worst, comparable to that of an optically-pumped high-power broadband laser which uses coumarin 545 T as the gain medium. For the sake of completeness, a series of measured interferometric distributions at various distances (z) of the detector x, from the slits j, was done and compared with theory. In all cases the measurements followed the theory with a fairly good degree of agreement.

Applicant's results are compatible with the emission of radiation with spatial coherence and spectral semi-coherence. Accordingly, Applicant has shown the emission of a low divergence, nearly diffraction limited, beam of light from a doubly spatially filtered tandem OLED device. This radiation exhibits an interferometric distribution compatible with the interferometric distributions observed from known laser sources.

Additional information is now provided on host materials. The host material in the light-emitting layer (LEL) is an electron-transporting, hole-transporting, or another material or combination of materials that support hole-electron recombination. The emitting material is often referred to as a dopant. The dopant is typically chosen from highly fluorescent dyes and phosphorescent compounds, e.g., transition metal complexes as described in WO 98/55561, WO 00/18851, WO 00/57676, and WO 00/70655. Dopant materials are typically incorporated at 0.01 to 20% level by volume of the host material.

Host and dopants known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, 6,020,078, 6,475,648, 6,534,199, 6,661,023, and U.S. Patent Application Publication Nos. 2002/0127427, 2003/0198829, 2003/0203234, 2003/0224202, and 2004/0001969.

One class of host materials includes metal complexes of 8-hydroxyquinoline (oxine) and similar derivatives capable of supporting electroluminescence. Exemplary of contemplated oxinoid compounds are those satisfying structural Formula E.

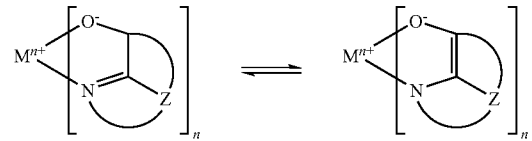

wherein:

M represents a metal;

n is an integer of from 1 to 4; and

Z independently in each occurrence represents the atoms completing a nucleus having at least two fused aromatic rings.

Another class of useful host materials includes derivatives of anthracene, such as those described in U.S. Pat. Nos. 5,935,721, 5,972,247, 6,465,115, 6,534,199, 6,713,192, U.S. Patent Application Publication Nos. 2002/0048687, 200/30072966, and WO 2004018587. Common examples include 9,10-bis (2-naphthalenyl)anthracene (AD-N), 2-(1,1-dimethyethyl)-9,10-bis(2-naphthalenyl)anthracene (TBADN). Other examples include different derivatives of AD-N, such as those represented by Formula F.

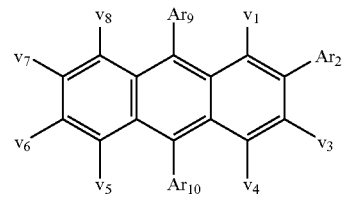

wherein:

$Ar_2$, $Ar_9$, and $Ar_{10}$ independently represent an aryl group;

$v_1$, $v_3$, $v_4$, $v_5$, $v_6$, $v_7$, and $v_8$ independently represent hydrogen or a substituent;

and Formula G.

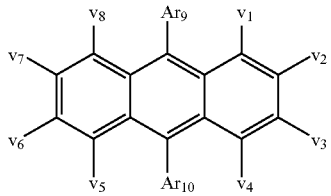

wherein:

$Ar_9$, and $Ar_{10}$ independently represent an aryl group;

$v_1$, $v_2$, $v_3$, $v_4$, $v_5$, $v_6$, $v_7$, and $v_8$ independently represent hydrogen or a substituent.

Yet another class of host materials includes rubrene and other tetracene derivatives. Some examples are represented by Formula H.

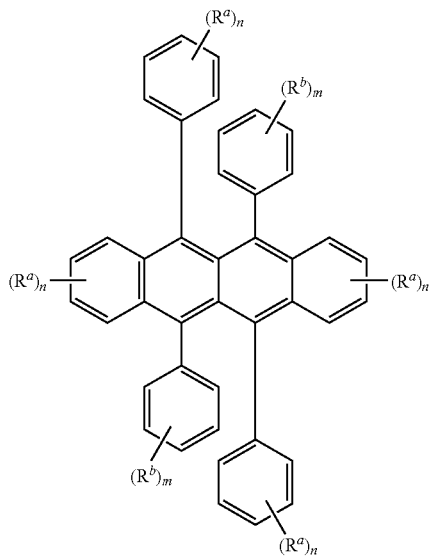

wherein:

$R^a$ and $R^b$ are substituent groups;

n is selected from 0-4; and m is selected from 0-5.

Other useful classes of host materials include distyrylarylene derivatives as described in U.S. Pat. No. 5,121,029, and benzazole derivatives, for example, 2,2',2"-(1,3,5-phenylene)tris[1-phenyl-1H-benzimidazole].

Desirable host materials are capable of forming a continuous film. The LEL can contain more than one host material in order to improve the device's film morphology, electrical properties, light emission efficiency, and operational lifetime. Mixtures of electron-transporting and hole-transporting materials are known as useful hosts. In addition, mixtures of the above listed host materials with hole-transporting or electron-transporting materials can make suitable hosts.

For efficient energy transfer from the host to the dopant material, a necessary condition is that the bandgap of the dopant is smaller than that of the host material. For phosphorescent emitters (including materials that emit from a triplet excited state, i.e. so-called "triplet emitters") it is also important that the triplet energy level of the host be high enough to enable energy transfer from host to dopant material.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrylium compounds, fluorene derivatives, periflanthene derivatives, indenoperylene derivatives, bis(azinyl)amine boron compounds, bis(azinyl)methane boron compounds, derivatives of distryrylbenzene and distyrylbiphenyl, and carbostyryl compounds. Among derivatives of distyrylbenzene, particularly useful are those substituted with diarylamino groups, also known as distyrylamines.

The host and dopant are small nonpolymeric molecules or polymeric materials including polyfluorenes and polyvinylarylenes (e.g., poly(p-phenylenevinylene), PPV). In the case of polymers, a small molecule dopant is molecularly dispersed into a polymeric host, or the dopant is added by copolymerizing a minor constituent into a host polymer.

All documents, patent applications, patents, journal articles, references, and other materials cited in the present application are hereby incorporated by reference.

The invention has been described in detail with particular reference to a presently preferred embodiment, but it will be understood that variations and modifications can be effected within the spirit and scope of the invention. The presently disclosed embodiments are therefore considered in all respects to be illustrative and not restrictive. The scope of the invention is indicated by the appended claims, and all changes that come within the meaning and range of equivalents thereof are intended to be embraced therein.

The invention claimed is:

1. A light-emitting device, comprising:
    a multi-layer stack of materials supported on a support member, the multi-layer stack including at least one organic light-emitting layer, an anode layer, and a cathode layer;
    a first spatial filter; and
    a second spatial filter spaced from the first spatial filter, the first spatial filter disposed intermediate the multi-layer stack of materials and the second spatial filter.

2. The light-emitting device of claim 1, further comprising at least one antireflection layer.

3. The light-emitting device of claim 2, wherein the support member is disposed intermediate the multi-layer stack of materials and the at least one antireflection layer, and the first spatial filter is disposed adjacent the at least one antireflection layer.

4. The light-emitting device of claim 1, wherein the support layer is optically transparent.

5. The light emitting device of claim 1, wherein a distance between the first and second spatial filters enables single transverse mode emission from the light-emitting device.

6. The light-emitting device of claim 1, wherein a distance between the first and second spatial filters ranges from about 100 mm to about 130 mm.

7. The light-emitting device of claim 1, wherein the emission beam has a divergence between 1.01 and 7.5 times the diffraction limit.

8. The light-emitting device of claim 1, wherein the light-emitting device has a spectral coherence of less than about 10 nm.

9. The light-emitting device of claim 1, wherein the emission beam has a divergence between 1.01 and 7.5 times the diffraction limit, and wherein the light-emitting device has a spectral coherence of less than about 10 nm.

10. A light-emitting device, comprising:
- a multi-layer stack of materials supported on a support member, the multi-layer stack including at least two organic light-emitting layers, an anode layer, and a cathode layer;
- a first spatial filter; and
- a second spatial filter spaced from the first spatial filter, the first spatial filter disposed intermediate the multi-layer stack of materials and the second spatial filter.

11. The light-emitting device of claim 10, further comprising at least one antireflection layer.

12. The light-emitting device of claim 11, wherein the support member is disposed intermediate the multi-layer stack of materials and the at least one antireflection layer, and the first spatial filter is disposed adjacent the at least one antireflection layer.

13. The light-emitting device of claim 10, wherein the support layer is optically transparent.

14. The light emitting device of claim 10, wherein a distance between the first and second spatial filters enables single transverse mode emission of the light-emitting device.

15. The light-emitting device of claim 10, wherein a distance between the first and second spatial filters ranges from about 100 mm to about 130 mm.

16. A light-emitting device, comprising:
- a multi-layer stack of materials supported on an optically transparent support member, the multi-layer stack including at least two organic light-emitting layers, an anode layer, and a cathode layer;
- an antireflection layer disposed adjacent the optically transparent support member;
- a first spatial filter disposed adjacent the antireflection layer; and
- a second spatial filter spaced from the first spatial filter, the first spatial filter disposed intermediate the multi-layer stack of materials and the second spatial filter, whereby an electrical excitation of the multi-layer stack of materials provides for an emission of a spatially coherent beam of light.

17. The light emitting device of claim 16, wherein a distance between the first and second spatial filters enables single transverse mode emission of the spatially coherent beam of light.

18. The light-emitting device of claim 16, wherein a distance between the first and second spatial filters ranges from about 100 mm to about 130 mm.

* * * * *